United States Patent [19]
Clemens

[11] Patent Number: 5,945,825
[45] Date of Patent: Aug. 31, 1999

[54] MAGNETIC FIELD-SENSITIVE SENSOR DEVICE WITH A PLURALITY OF GMR SENSOR ELEMENTS WHICH HAVE PREDETERMINED DIRECTIONS OF MAGNETIZATION

[75] Inventor: Wolfgang Clemens, Puschendorf, Germany

[73] Assignee: Siemens Aktiengesellschaft, München, Germany

[21] Appl. No.: 08/856,853

[22] Filed: May 15, 1997

[30] Foreign Application Priority Data

May 15, 1996 [DE] Germany ............... 196 19 806

[51] Int. Cl.⁶ ............... G01R 33/09; G01R 33/06; H01L 43/08; H01L 43/12
[52] U.S. Cl. ............... 324/252; 338/32 R
[58] Field of Search ............... 324/249, 252; 338/32 R

[56] References Cited

U.S. PATENT DOCUMENTS

| | | |
|---|---|---|
| 4,464,625 | 8/1984 | Lienhard et al. . |
| 5,686,837 | 11/1997 | Coehoorn et al. ............... 324/252 |

FOREIGN PATENT DOCUMENTS

| | | |
|---|---|---|
| 0 483 373 | 5/1991 | European Pat. Off. . |
| 0 710 850 | 5/1996 | European Pat. Off. . |
| 33 17 594 | 11/1984 | Germany . |
| 42 32 244 | 9/1992 | Germany . |
| 42 43 357 | 12/1992 | Germany . |
| 42 43 358 | 12/1992 | Germany . |
| 42 27 495 | 8/1994 | Germany . |
| 94/17426 | 8/1994 | WIPO . |
| WO95/28649 | 10/1995 | WIPO . |

OTHER PUBLICATIONS

E. Schruefer, Elektrische, Meβtechnick, 6th Edition, 1995, pp. 226–237.

*Primary Examiner*—Walter E. Snow
*Attorney, Agent, or Firm*—Kenyon & Kenyon

[57] ABSTRACT

A magnetic field-sensitive sensor device contains two branch circuits having a plurality of GMR sensor elements, each of whose thin-film structure has a bias layer portion. At least one pair of sensor elements should have magnetizations of their bias layer portions that have at least essentially an opposite orientation relative to each other and thereby define a reference direction. At least one additional sensor element has a magnetization of its bias layer portion that forms a predetermined angle with the reference direction.

13 Claims, 11 Drawing Sheets

MAGNETIC FIELD-SENSITIVE SENSOR DEVICE WITH A PLURALITY OF GMR SENSOR ELEMENTS WHICH HAVE PREDETERMINED DIRECTIONS OF MAGNETIZATION

FIELD OF THE INVENTION

The present invention relates to a sensor device with a plurality of giant magneto-resistive (GMR) sensor elements for detecting an external magnetic field.

BACKGROUND INFORMATION

In layers of ferromagnetic transition metals such as Ni, Fe or Co and alloys thereof, an electric resistance of a layer may depend on the size and direction of a magnetic field permeating the layer's material. The effect that occurs with such layers is called anisotropic magneto-resistance (AMR), or the anisotropic magneto-resistive effect. Physically it is based on different scattering cross sections of electrons with different spins and their spin polarity in the D band. Therefore, these spinning electrons are referred to as majority and minority electrons. A thin layer of such a magneto-resistive material, with magnetization in the plane of the layer, is generally provided for use in magneto-resistive sensors. Change in the electric resistance of the layer, caused by rotation of the magnetization plane in response to a direction of an electrical current passing through the layer, may amount to a plurality of percentage of the normal isotropic (i.e., ohmic) resistance of the layer.

Magneto-resistive layer systems containing a plurality of ferromagnetic layers arranged in a stack and separated from each other by nonmagnetic intermediate layers, with the magnetization of each preferably in the plane of the layer, are known. The thickness of each individual layer is selected to be much smaller than the mean free path length of the conduction electrons. In such multilayer systems, a giant magneto-resistive effect or giant magneto-resistance (GMR) may also occur in addition to the above-mentioned anisotropic magneto-resistive effect (AMR). Such multilayer systems are described in European Patent No. 0 483 373 A and German Patents Nos. 42 32 244 A, 42 43 357 A and 42 43 358 A. Such a GMR effect is based on different intensities of the scattering of the majority and minority conduction electrons at the interfaces between the ferromagnetic layers and the adjacent nonmagnetic intermediate layers and on the scattering effects within these layers. The GMR effect is an isotropic effect and may be much greater than the anisotropic effect (AMR). As such, the GMR effect may assume values amounting to at least 70% of the normal isotropic resistance.

With a first type of such a multilayer system having a GMR effect, adjacent magnetic layers have a magnetically opposite, or antiparallel, orientation without an external magnetic field because of their mutual coupling. This orientation can be converted to a parallel orientation by an applied external magnetic field. On the other hand, a second type of GMR multilayer system has a bias layer, or a bias layer portion, that is magnetically harder than a (magnetically softer) measurement layer. These two layers are mutually isolated magnetically by a nonmagnetic intermediate layer. Without an external magnetic field, the magnetizations of the two magnetic layers have some relationship to each other, e.g., antiparallel. Under the influence of an external magnetic field, the magnetization of the magnetically soft measurement layer is oriented according to the direction of the field, whereas the orientation of the magnetically harder bias layer remains unchanged. The angle between the directions of magnetization of the two magnetic layers determines the resistance of the multilayer system. With a parallel orientation (i.e., same direction), the resistance is low, and with an opposite orientation the resistance is high. This fact is utilized in corresponding magnetic field sensors.

A sensor device with four such magnetic field sensor elements wired to form a bridge circuit is described in German Patent No. DE 44 27 495 A. In each branch of the bridge, the two sensor elements have magnetizations of their bias layer portions oriented at least essentially opposite to each other. These sensor elements are thus of the second type mentioned above.

With such multilayer systems having GMR sensor elements of the second type, the electric resistance can be broken down into two components, namely a magnetic field-sensitive component $\Delta R$ and a fundamental resistance $R_0$ that is not sensitive to the magnetic field influence. In sensitive systems, the field-sensitive component $\Delta R$ typically amounts to 5% to 30% of the fundamental resistance $R_0$. In the electronic analysis of the sensor signal, fundamental resistance $R_0$ acts as an interfering offset voltage. It has also been found that fundamental resistance $R_0$, in particular, depends on an operating temperature T. For example, at room temperature $T_a$ the fundamental resistance $R_0$, which is characterized by a strongly temperature-dependent contribution of the photons, is approximately proportional to $T/T_a$ and amounts to approximately 0.1% per degree Kelvin. Such a change is undesirable for most applications. For this reason, individual magneto-resistive sensors have been provided with an additional sensor, or a bridge design with four sensors.

With the known bridge circuit having four GMR sensor elements whose magnetic layer systems are of the second type having a magnetically harder bias layer portion and a magnetically softer measurement layer, only an angle range of 180° with regard to one component of an external magnetic field can be detected. Consequently, for the full angle detection range of 360° it is therefore necessary to provide another sensor device with a bridge circuit, where the reference axes of the two bridges are normal to each other. In other words, two sensor devices, whose magnetizations are oriented normal to each other, are required for the magnetic field information, and sensor devices with bridge circuits are required for offset voltage compensation. However, this means that a total of eight sensor elements are needed, which would take up a large amount of area and would have to be balanced with respect to each other.

SUMMARY OF THE INVENTION

An object of the present invention, therefore, is to provide a sensor device, such that information regarding the direction and/or strength of an external magnetic field can be obtained with a few sensor elements, and such that the influence of the temperature dependence of the totality of the elements can be suppressed.

The present invention achieves this object and others by providing at least one pair of sensor elements with magnetizations of their bias layer portions having at least essentially an opposite orientation to one another and thus defining a reference line, and by providing at least one additional sensor element whose bias layer portion magnetization forms a predetermined angle with the defined reference line.

The advantages associated with the sensor device of the present invention can be seen in particular in that the two components of the electric resistance and thus their fieldand temperature-dependence are to be analyzed separately electronically, with an offset voltage no longer present. The present invention is based on the finding that a minimum of two sensor elements, with an opposite orientation of the magnetizations of their bias layer portions defining a reference direction, can be used to generate a substantially purely temperature-dependent signal. The first branch circuit is needed for temperature compensation and also for determination of the direction up to 180°. The other branch circuit serves to increase the angle range to be detected to 360° and/or increase the accuracy in detection. The dimensions of the sensor device are minimized because of the minimum number of sensor elements. Therefore, such sensor devices can also be manufactured inexpensively.

DETAILED DESCRIPTION

Sensor elements suitable for the sensor device according to the present invention are based on known embodiments of magneto-resistive elements with multilayer systems that have a giant magneto-resistive effect (GMR) and are manufactured by thin-film technology. Their magneto-resistive effect $M_r$ should be at least 2%. It holds by definition that:

$$M_r = [R(\uparrow\downarrow) - R(\uparrow\uparrow)] / R(\uparrow\uparrow).$$

Because of the sensitivity of the sensor elements to the direction of the field, the magneto-resistive effect $M_r$ represents the difference in resistance between the parallel and antiparallel or opposite orientations of the measurement layer with respect to the bias layer or a corresponding bias layer portion. It is assumed that the magnetically softer measurement layer is oriented according to the direction of the external magnetic field, while the hard bias layer retains its direction of magnetization. In the equation given above, the mutual orientation of the magnetization of the measurement layer and the bias layer is illustrated by the position of the arrows.

Figure 1:
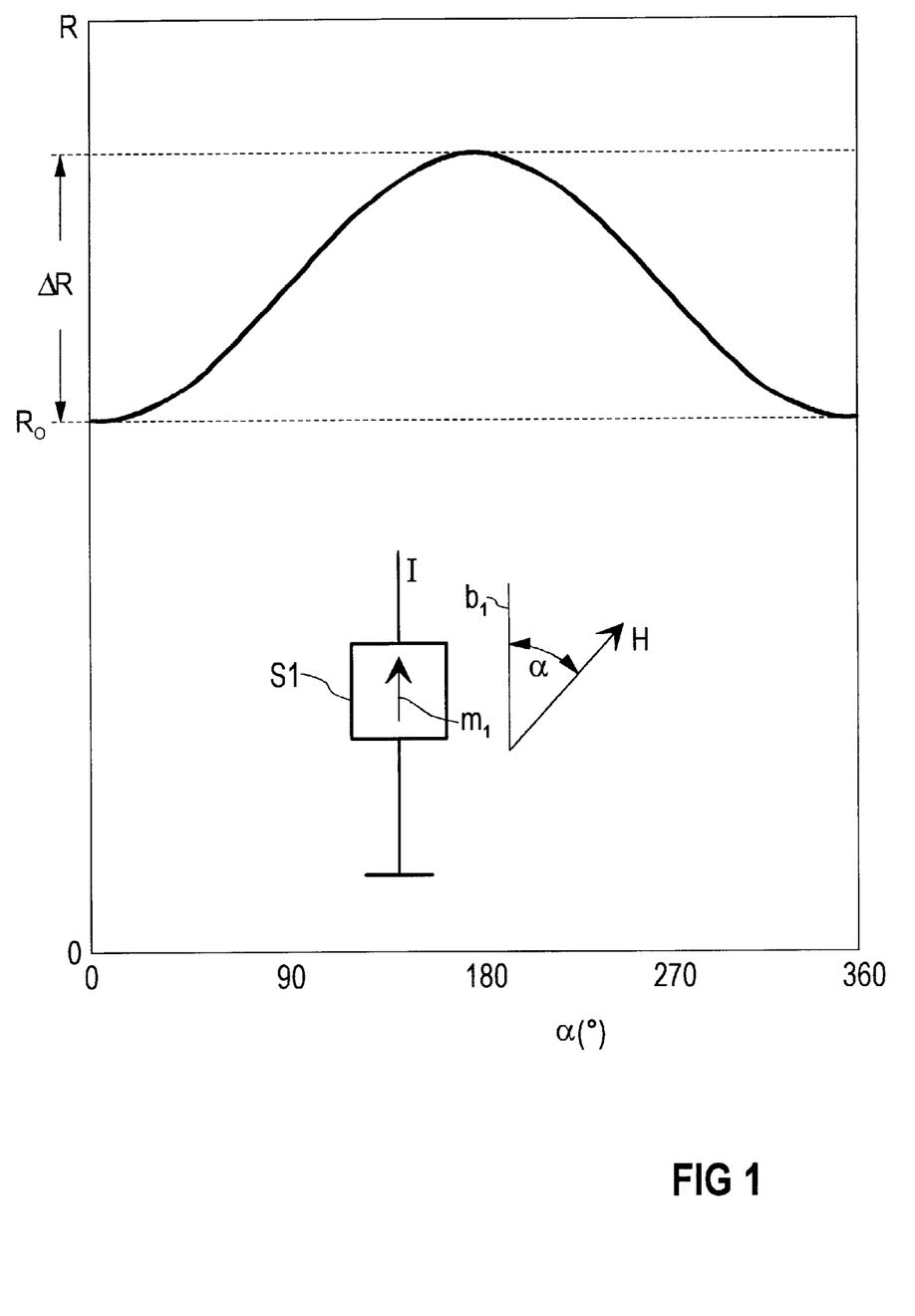
FIG. 1 is a graph showing the electric resistance characteristics of a known sensor element with a GMR effect.

Such a sensor element contains a thin-film package typical of a GMR element applied to a substrate. This thin-film package has a magnetic bias layer portion comprising one or more layers. With this bias layer portion, a fixed direction of magnetization is defined as a reference direction of the sensor element. In FIG. 1, the direction of magnetization on a sensor element S1 is illustrated by a line designated as $m_1$, and marked with an arrow on a sensor element S1. This line represents a reference direction or line $b_1$ for the sensor element shown.

Furthermore, such sensor elements contain a magnetically soft measurement layer whose direction of magnetization is oriented according to an externally applied magnetic field. The resistance of the sensor element depends on the relative orientation of the magnetization of the measurement layer with respect to that of the bias layer portion. This change in resistance can be used to determine the direction of a magnetic field applied and thus, for example, the rotational positions or absolute positions (see also International Patent Application No. WO 94/17426).

The resistance R of such a sensor element is composed essentially of a fundamental resistance $R_0$ and a field-sensitive resistance $\Delta R$. The fundamental resistance depends essentially only on the temperature T, while the magnetic field-sensitive component depends on both the temperature T and an angle $\alpha$ formed by an external magnetic field H within a predetermined field strength range with the reference direction $b_1$ of the sensor element (see FIG. 1). In other words, it holds that:

$$R(\alpha, T) = R_0(T) + \Delta R(\alpha, T). \tag{1}$$

The angle dependence of the field-sensitive component can be described essentially by a cosine-like dependence on the angle $\alpha$. FIG. 1 shows a corresponding curve in a diagram:

$$R(\alpha, T) = R_0(T) + \tfrac{1}{2}\Delta R(T)[1 - \cos \alpha]. \tag{2}$$

Resistance R (in arbitrary units) is plotted on the ordinate in the diagram and the angle $\alpha$ (in degrees) is plotted on the abscissa. When $R = R_0$, the directions of magnetization of the bias layer portion and the measurement layer are oriented in parallel, whereas the magnetization directions are oriented opposite to each other when $R = R_0 + \Delta R$.

For a sensor element having a current I flowing through it, the corresponding voltages U can be measured:

$$\begin{aligned} U(\alpha, T) &= R(\alpha, T)/I \\ &= U_0(T) + \Delta U(\alpha, T) \\ &= U_0(T) + \tfrac{1}{2}\Delta U(T)[1 - \cos\alpha]. \end{aligned} \tag{3}$$

Figure 2:
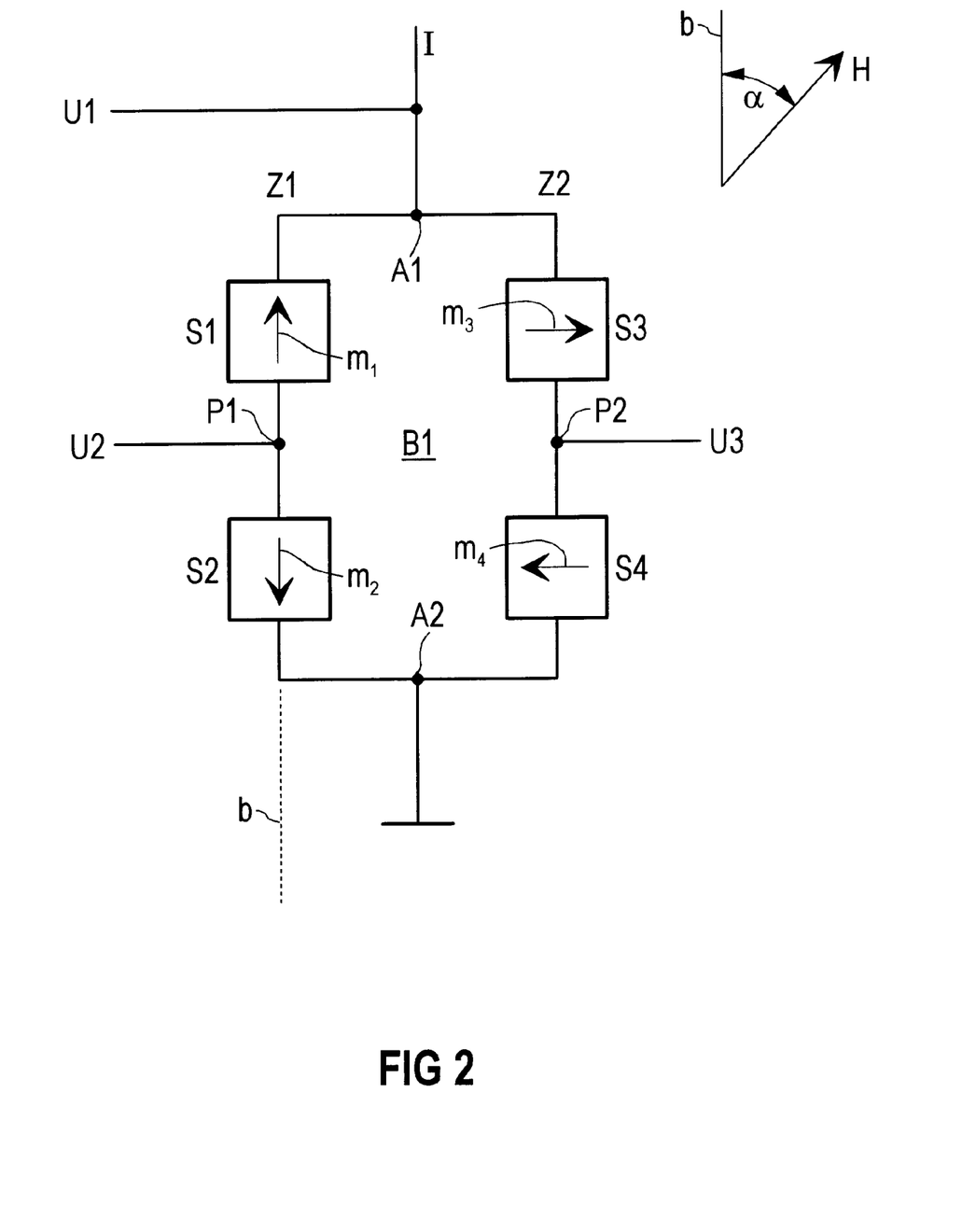
FIG. 2 is a schematic showing a sensor device with a bridge circuit having four sensor elements with the GMR effect.

A sensor device according to the present invention includes at least three such sensor elements, all of which preferably have basically the same fundamental resistance $R_0(T)$ and field-sensitive resistance $\Delta R(\alpha, T)$. Therefore, all elements may have the same design and, in particular, the same geometry. Referring to FIG. 2, a bridge arrangement (bridge circuit) B1 with four sensor elements S1 through S4 can advantageously be provided (see, for example, E. Schruefer, *Elektrische Meßtechnik* [Electric Measurement Technology], $6_{th}$ edition, 1995, Carl Hanser Verlag, Munich, pages 226–237). The bridge circuit B1 contains two branch circuits or bridge branches Z1 and Z2 that are connected in parallel between two terminals A1 and A2 of the bridge and represent two independent half bridges. A current I should be passed over the bridge at terminals A1 and A2. Each bridge branch Z1 and Z2 contains two series-connected sensor elements S1 and S2 or S3 and S4. A measurement point P1 or P2 of the bridge is located between the two elements of each bridge branch. A measured voltage U2 or U3 can be picked off at these measurement points. With the bridge according to the present invention, a bridge voltage is not possible between the measurement points by simply taking the difference between the voltages. Each branch circuit representing a half bridge must be considered independently, i.e., voltages U2 and U3 can be picked off independently. Furthermore, in the figure, oriented magnetizations $m_1$ through $m_4$ of the respective bias layer portions are represented by lines with arrows on the individual sensor elements S1 through S4. For example, magnetizations $m_1$ and $m_2$ define a reference line b of the sensor device. According to the present invention, in each bridge branch Z1, Z2, the two sensor elements S1, S2 or S3, S4 should have magnetizations $m_1$, $m_2$ or $m_3$, $m_4$ that have approximately opposite orientations. In addition, magnetizations $m_1$, $m_2$ of the bias layer portions of sensor elements S1, S2 in the first bridge branch Z1 and reference line b should run so that they form an angle not equal to zero or 180° with reference lines defined by the magnetization $m_3$, $m_4$ of the bias layer portions of sensor elements S3, S4 in the other bridge branch Z2. In an advantageous embodiment, an angle between 10° and 170°, in particular between 20° and 160°, preferably between 40° and 140° is selected. In the embodiment according to FIG. 2, magnetizations $m_1$, $m_2$ and $m_3$, $m_4$ are at least approximately normal to each other. It is advantageous for all of the sensor elements of the bridge circuit to have, to the extent possible, the same fundamental resistance $R_0$ (T) and field-sensitive resistance $\Delta R(\alpha, T)$. If a current I flows over the bridge, voltages U1, U2 and U3 that depend on the angle $\alpha$ of the external magnetic field H with respect to reference line b are obtained at terminal A1 and at measurement points P1 and P2. In the embodiment illustrated in FIG. 2, terminal A2 is at zero potential.

Figure 3:
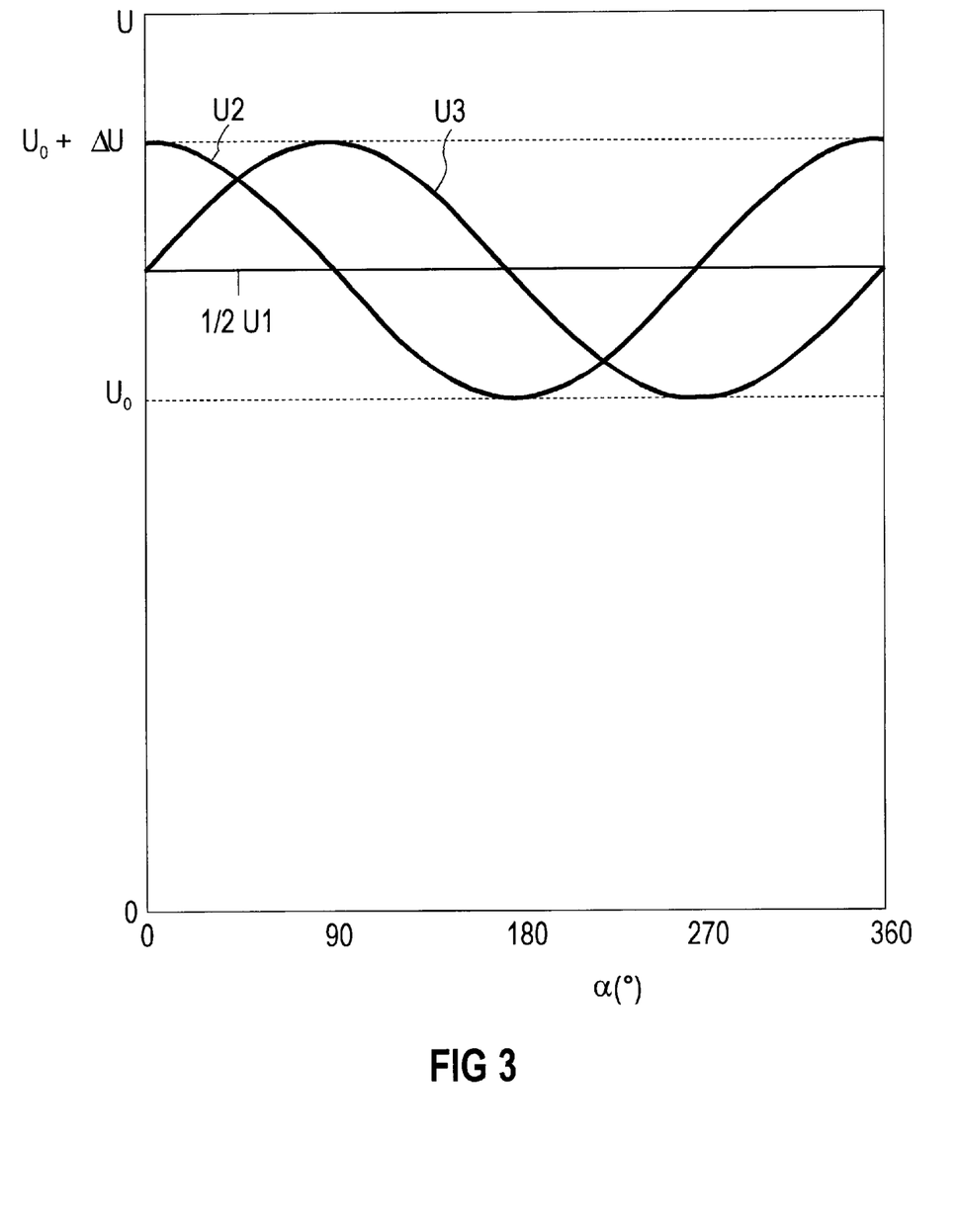
FIG. 3 is a graph showing the voltages on the bridge circuit shown in FIG. 2, at a constant temperature.

FIG. 3, where voltage U (in arbitrary units) is plotted on the ordinate and the angle $\alpha$ (in degrees) is shown on the abscissa, shows the following voltages:

$$U1 = 2[U_0(T) + \tfrac{1}{2}\Delta U(T)]$$

$$U2 = U_0(T) + \tfrac{1}{2}\Delta U(T)(1 + \cos\alpha)$$

$$U3 = U_0(T) + \tfrac{1}{2}\Delta U(T)(1 + \sin\alpha) \quad (4)$$

$U_0$ is a voltage determined by a fundamental resistance. Voltage U1 and thus the bridge resistance depend essentially only on the temperature of the sensor device, but not on the magnetic field applied. Appropriate subtraction of voltages U1, U2 and U3 yields a signal that depends only on the field-sensitive component of voltages $\Delta U$:

$$U2 - \tfrac{1}{2}U1 = \tfrac{1}{2}\Delta U(T)\cos\alpha$$

$$U3 - \tfrac{1}{2}U1 = \tfrac{1}{2}\Delta U(T)\sin\alpha \quad (5)$$

$$2U2 - U1 = \Delta U(T)\cos\alpha$$

$$2U3 - U1 = \Delta U(T)\sin\alpha \quad (6)$$

Figure 4:
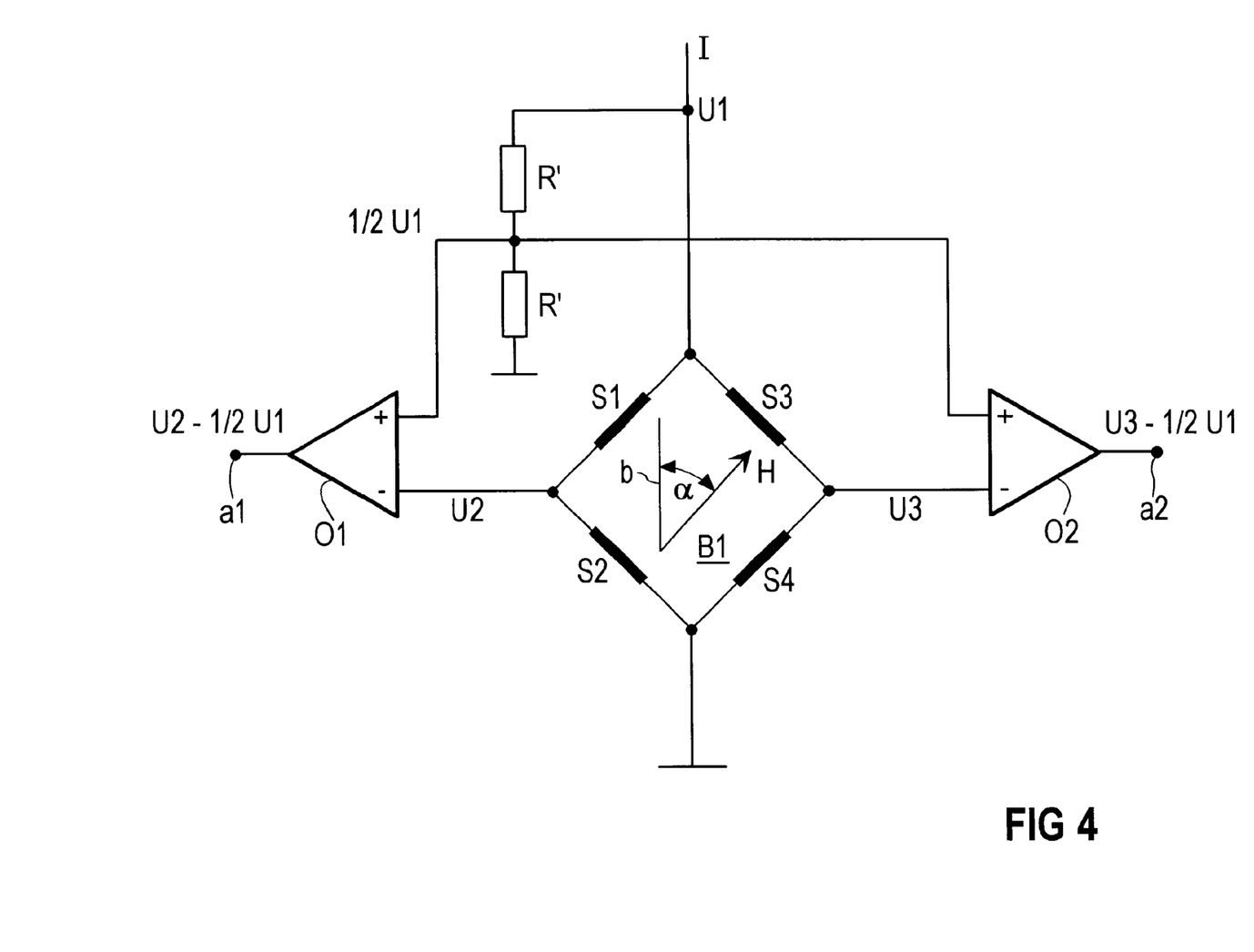
FIG. 4 is a schematic of an arrangement for the signal analysis of the bridge circuit shown in FIG. 2.
Figure 5:
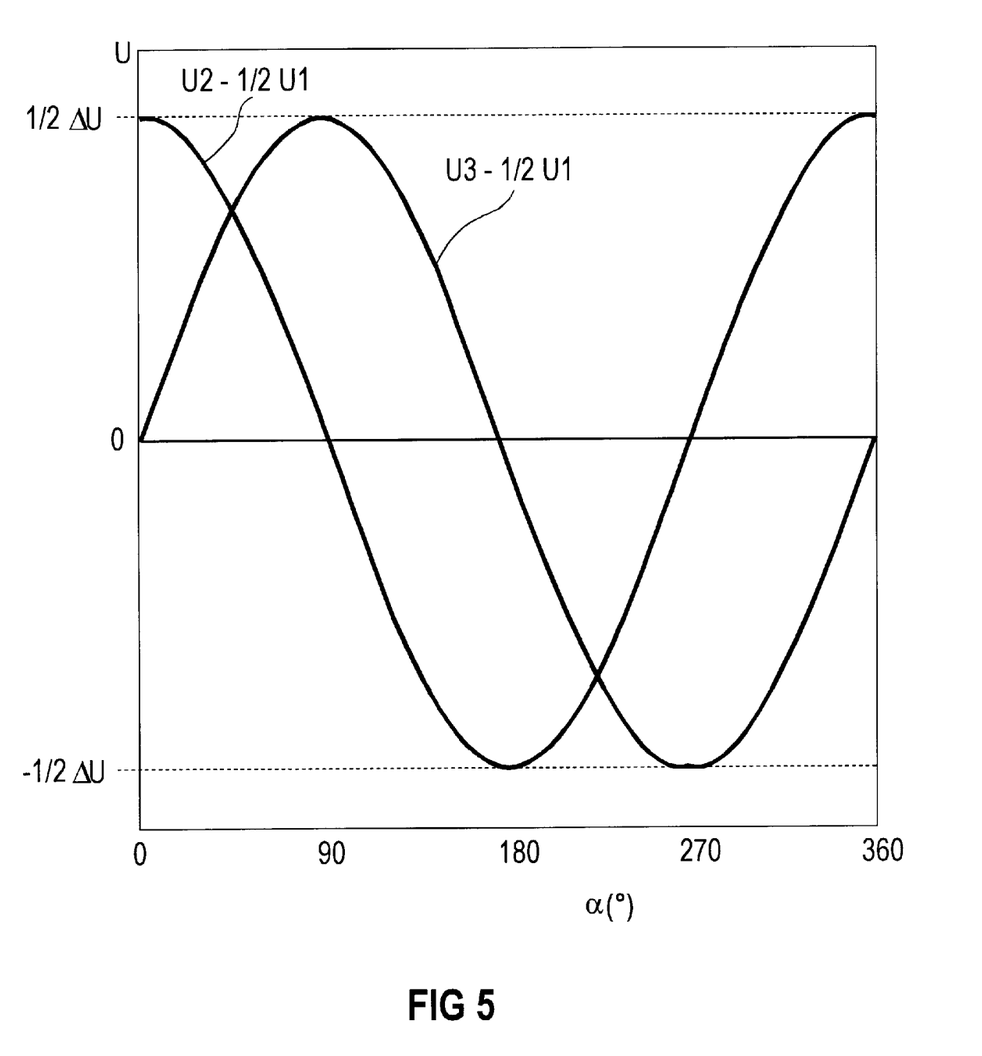
FIG. 5 is a graph showing the difference in the voltages on the bridge circuit shown in FIG. 2, with the signal analysis according to FIG. 4.

The differences indicated in equations (5) are obtained, for example, with a circuit such as that shown in FIG. 4. The two resistors R' and R" of this circuit should be high resistances and serve as voltage dividers for the voltage U1. Resistors R' and R" may be unequal because of manufacturing-related differences in the resistances of the sensor elements. However, an ideal field where R'=R" is assumed below. The diamond-shaped arrangement in the middle of the circuit is bridge circuit B1 of the sensor device according to the present invention with four sensor elements S1 through S4 according to FIG. 2. Two operational amplifiers of the circuit are designated as O1 and O2. Voltages U2−½ U1 and U3−½ U1 can be picked off at their outputs a1 and a2 according to equations (5). FIG. 5 shows curves for these voltage signals, where voltage U (in arbitrary units) is shown on the ordinate and the angle $\alpha$ (in degrees) is plotted on the abscissa. As FIG. 5 shows, two sinusoidal or cosinusoidal voltage signals with an amplitude of $\pm\tfrac{1}{2}\Delta U$ are obtained. This value corresponds to half the voltage signal of a conventional standard bridge.

Figure 6:
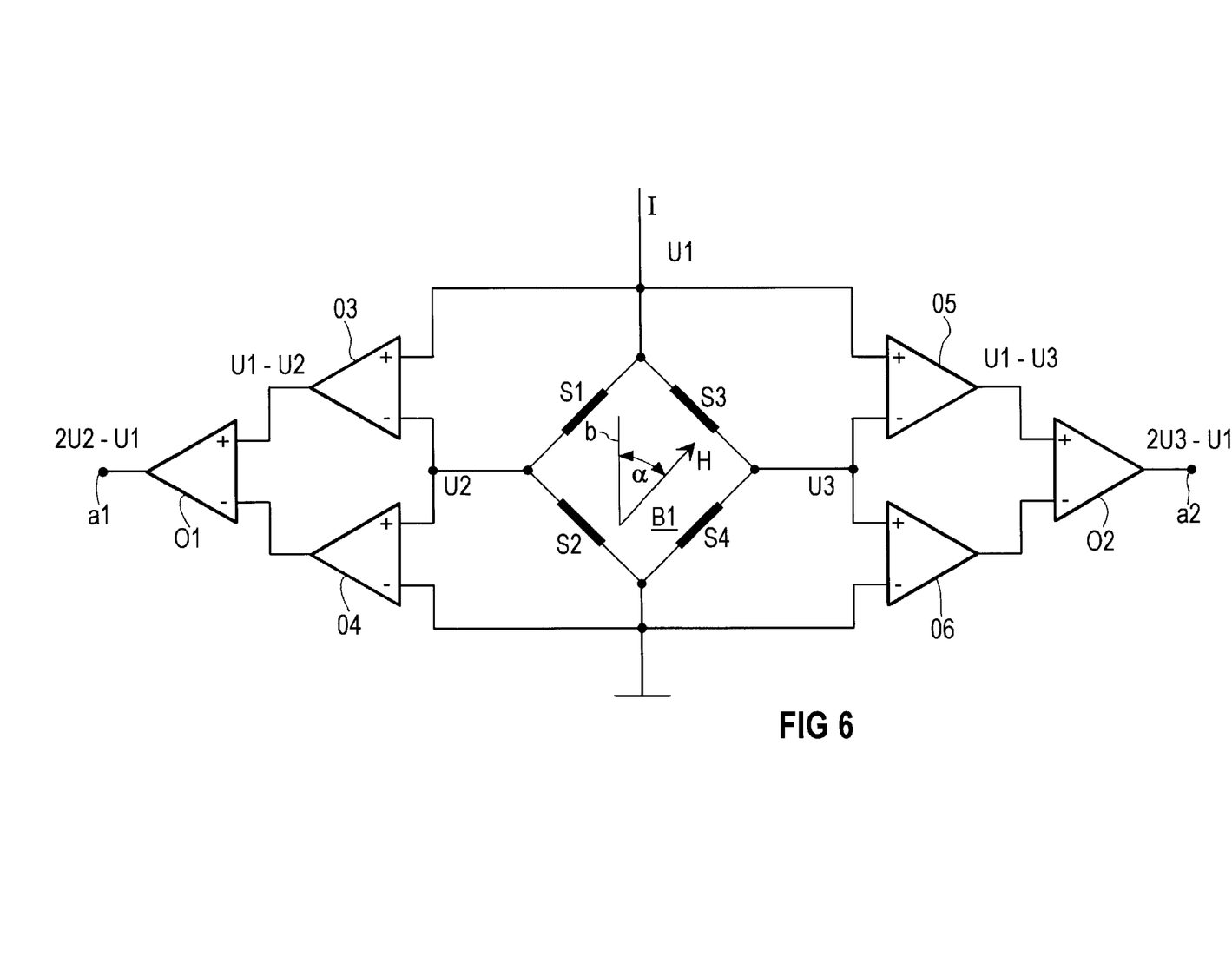
FIG. 6 shows a schematic of an arrangement for the signal analysis of the bridge circuit shown in FIG. 2.
Figure 7:
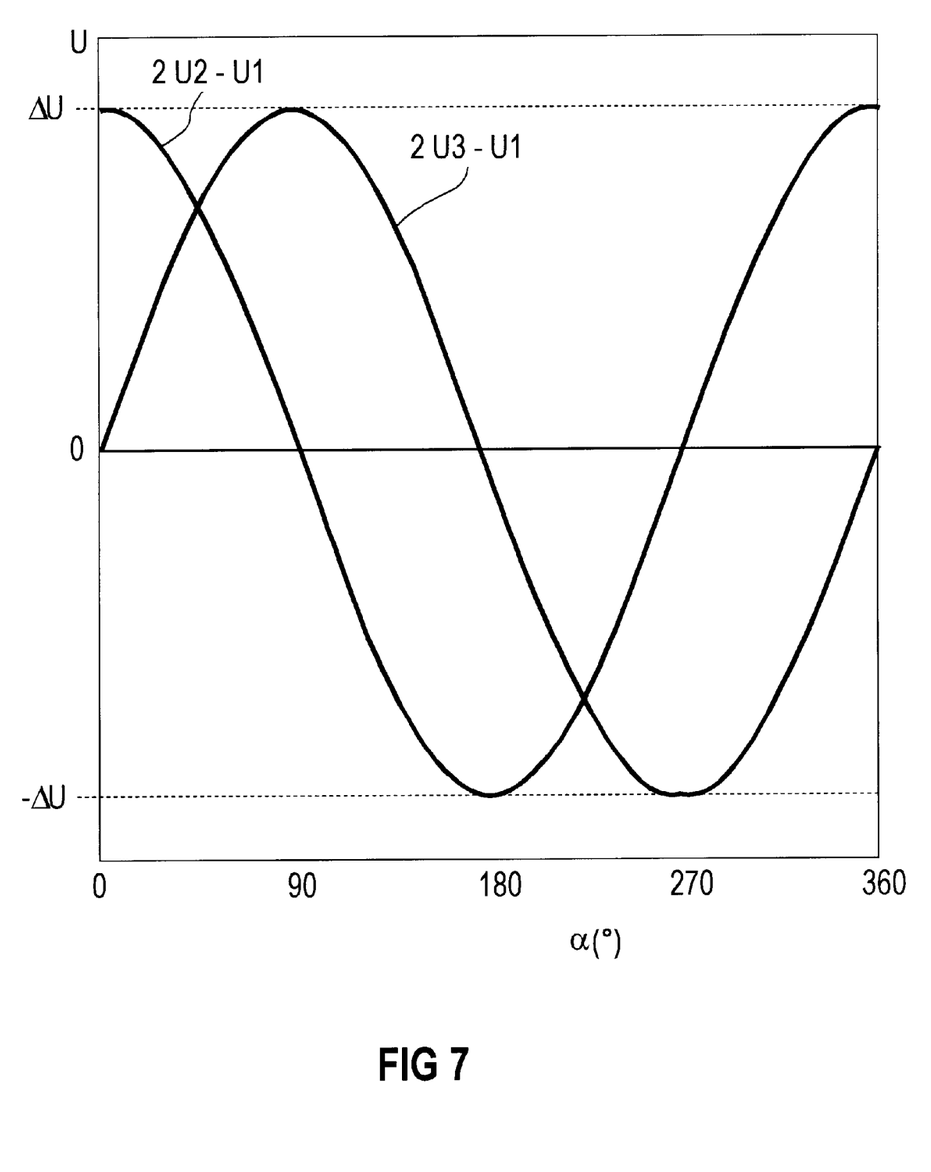
FIG. 7 is a graph of the difference in the voltages on the bridge circuit shown in FIG. 2, with the signal analysis according to FIG. 6.

The voltage differences, e.g., according to equations (6), are obtained, for example, with a circuit such as that shown in FIG. 6. In comparison with the embodiment of FIG. 4, this requires two additional pairs of operational amplifiers O3, O4 and O5, O6. The voltage difference U1−U2 is applied to the non-inverting input of operational amplifier O1, while the non-inverting input of operational amplifier O2 is at voltage difference U1−U3. Then voltage differences 2 U2−U1 and 2 U3−U1 can be picked off at outputs a1 and a2 of operational amplifier O1 and O2, respectively. The corresponding voltage signals are shown in FIG. 7, which corresponds to FIG. 5. This diagram shows that two sinusoidal and cosinusoidal voltage signals with an amplitude of $\pm\Delta U$ are obtained. This value corresponds to the voltage signal of the above-mentioned standard bridge.

Temperature compensation is then performed on the signals according to equations (5) and (6) by means of a suitable circuit in a known way and the signals are processed further, e.g., to determine the direction of external magnetic field H, which is necessary for a contactless potentiometer.

Figure 8:
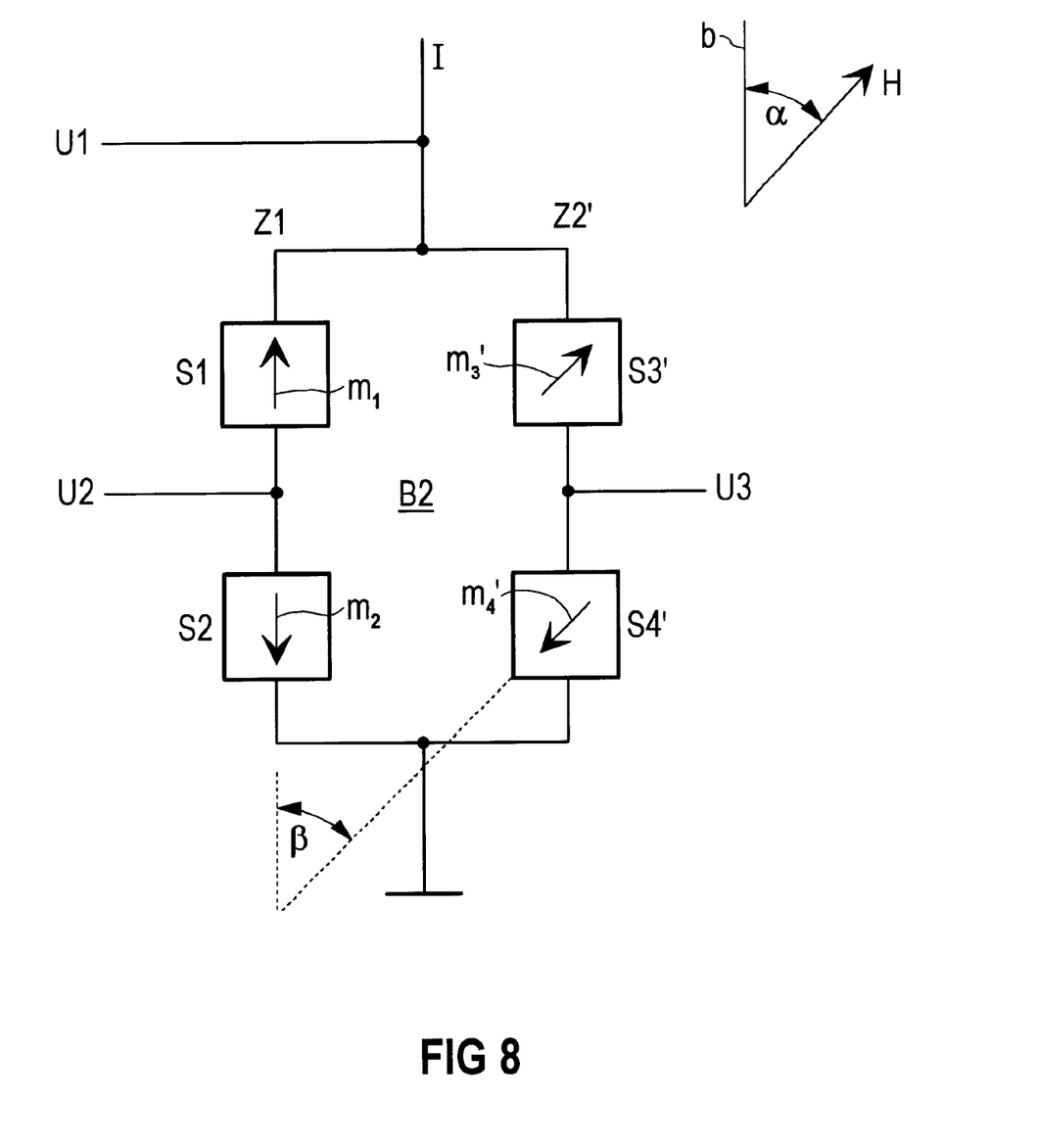
FIG. 8 is a schematic of a sensor device with a bridge circuit with four sensor elements.

According to the embodiment of a bridge circuit B1 of a sensor device as illustrated in FIG. 2, it has been assumed that magnetizations $m_3$ and $m_4$ of the bias layer portions of sensor elements S3 and S4 are at least approximately normal to reference line b defined by the directions of magnetizations $m_1$ and $m_2$ of the bias layer portions of the other sensor elements S1 and S2. However, it is also possible for the directions of magnetizations $m_3$ and $m_4$ to form any angle ($\neq 0°$ or $\neq 180°$) with reference line b. It is advantageous for the angle to be between 10° and 170°, in particular between 20° and 160°, and preferably between 40° and 140°. FIG. 8 shows a corresponding embodiment of a bridge circuit B2 in a diagram corresponding to that in FIG. 2. Bridge circuit B2 contains four sensor elements S1, S2, S3' (with a bias magnetization $m_3'$) and S4' (with a bias magnetization $m_4'$). Bias magnetizations $m_3'$ and $m_4'$, i.e., the reference lines defined by them, form an angle $\beta$ of 45° with reference line b, which is also defined by magnetizations $m_1$ and $m_2$. This yields the following signals by analogy with FIG. 2:

$$U2 - \tfrac{1}{2}U1 = \tfrac{1}{2}\Delta U(T)\cos\alpha$$

$$U3 - \tfrac{1}{2}U1 = \tfrac{1}{2}\Delta U(T)\cos(\alpha-\beta) \quad (7)$$

This bridge circuit B2 can be used in particular to improve the resolution of a contactless potentiometer in a certain angle range because the linear ranges of the cosinusoidal signals can be utilized better.

In deviation from the embodiments of bridge circuits B1 and B2 illustrated here, it is of course also possible to replace individual sensor elements with a plurality of elements connected in parallel or in series.

Furthermore, sensor devices according to the present invention may also have a series or parallel circuits consisting of at least two bridge circuits B1 and/or B2. It is also possible for the reference directions of the individual bridge circuits to form a predetermined angle of 45° or 90°, for example.

Figure 9:
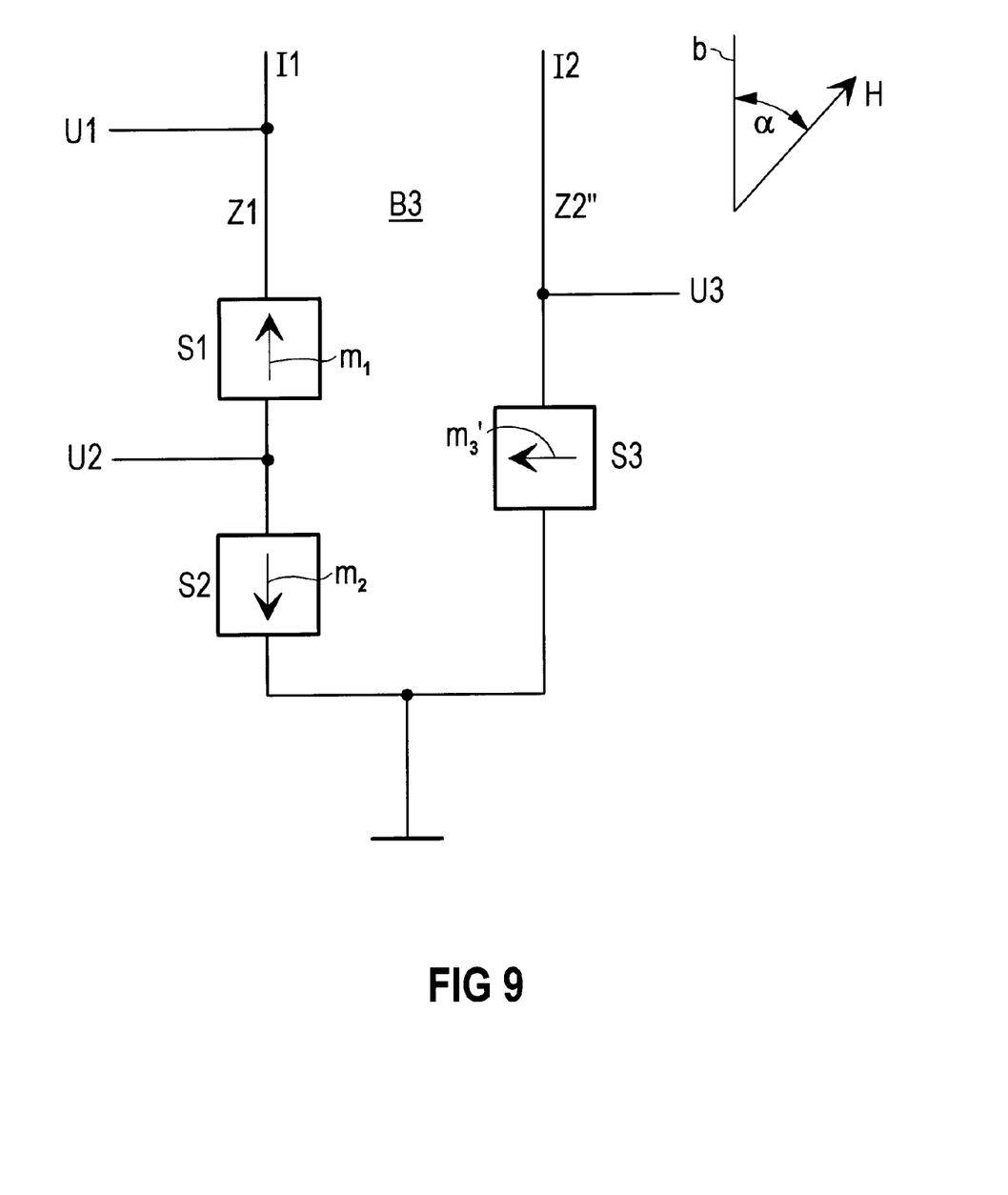
FIG. 9 is a schematic of a sensor device with three sensor elements in two branch circuits.

The bridge circuits of sensor elements are only one special case of the sensor devices according to the present invention. Only one pair of sensor elements for the purely temperature-dependent signal component and a single sensor element for the temperature- and field-dependent signal component are necessary to separate the signal into a purely temperature-dependent signal component and a temperature- and field-dependent signal component. FIG. 9 shows a first embodiment of a pseudo-bridge circuit B3 having one pair of sensor elements S1, S2 whose bias magnetization directions are opposite to one another and define a reference line b; the pseudo-bridge circuit also has a single sensor element S3 whose bias magnetization direction is normal to reference line b. The pair of sensor elements S1, S2 is connected in series and current I1 flows through them. Sensor element S3, through which a current I2 flows from a separate power supply, is connected in parallel with the former. The two branch circuits Z1 and Z2" carrying currents I1 and I2 are arranged in parallel according to the embodiment illustrated here and are both at zero potential at one end. Under the assumption that the two currents I1 and I2 are equal, the resulting analysis is similar to that with bridge circuit B1, but in this case there is the advantage of a comparatively smaller number of sensor elements. Thus, equations (5) hold for the signals here.

Figure 10:
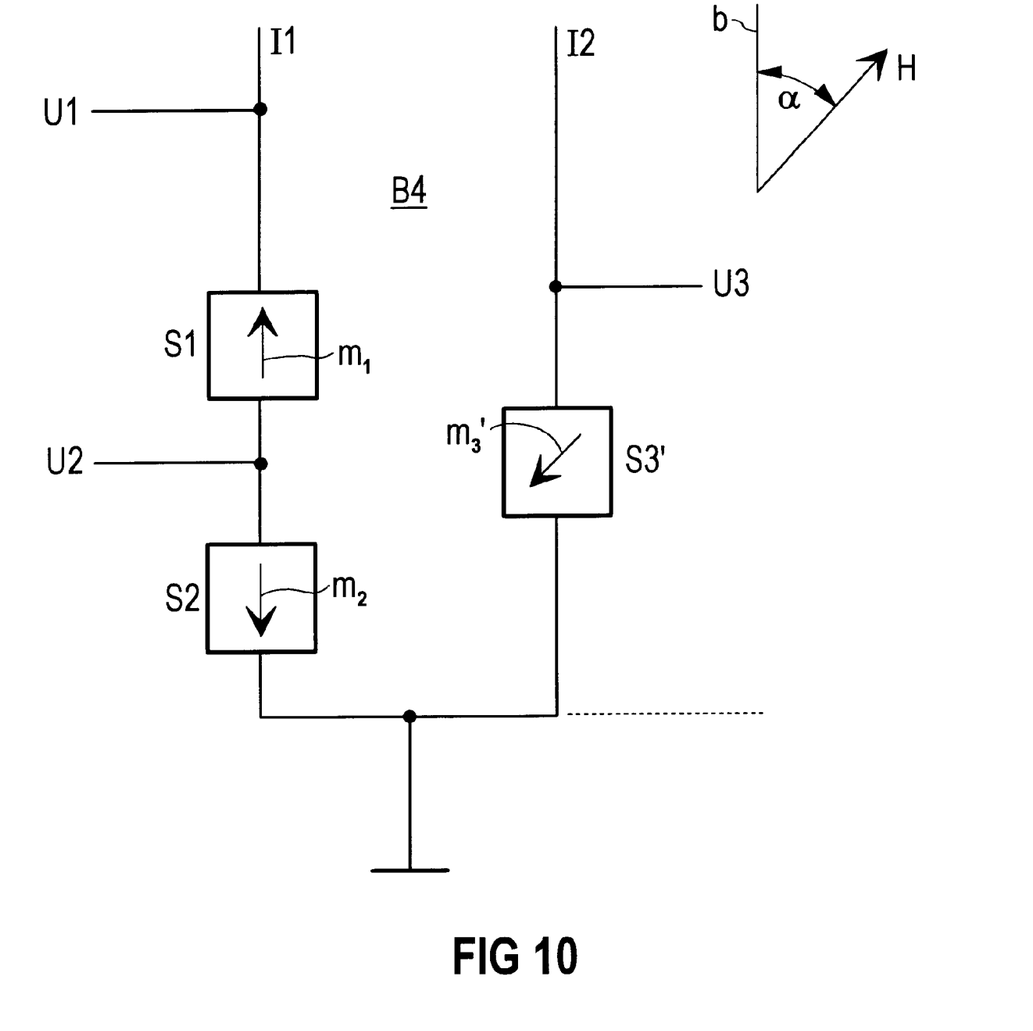
FIG. 10 is a schematic of a sensor device with three sensor elements in two branch circuits.

The additional embodiment of a pseudo-bridge circuit B4 of three sensor elements S1, S2 and S3' illustrated in FIG. 10 differs from bridge circuit B3 according to FIG. 9 only in that its single sensor element S3' forms an arbitrary angle β, for example, of 45° with reference line b of sensor element pair S1, S2 (according to FIG. 8). Here again, as is obviously also the case in the embodiment according to FIG. 9, many additional individual sensor elements may be connected in parallel with any desired bias magnetization directions, but always with separate power supplies. Equations (7) are then obtained for the signals of the pseudo-bridge circuit B4 by analogy with bridge circuit B2 according to FIG. 8.

Figure 11:
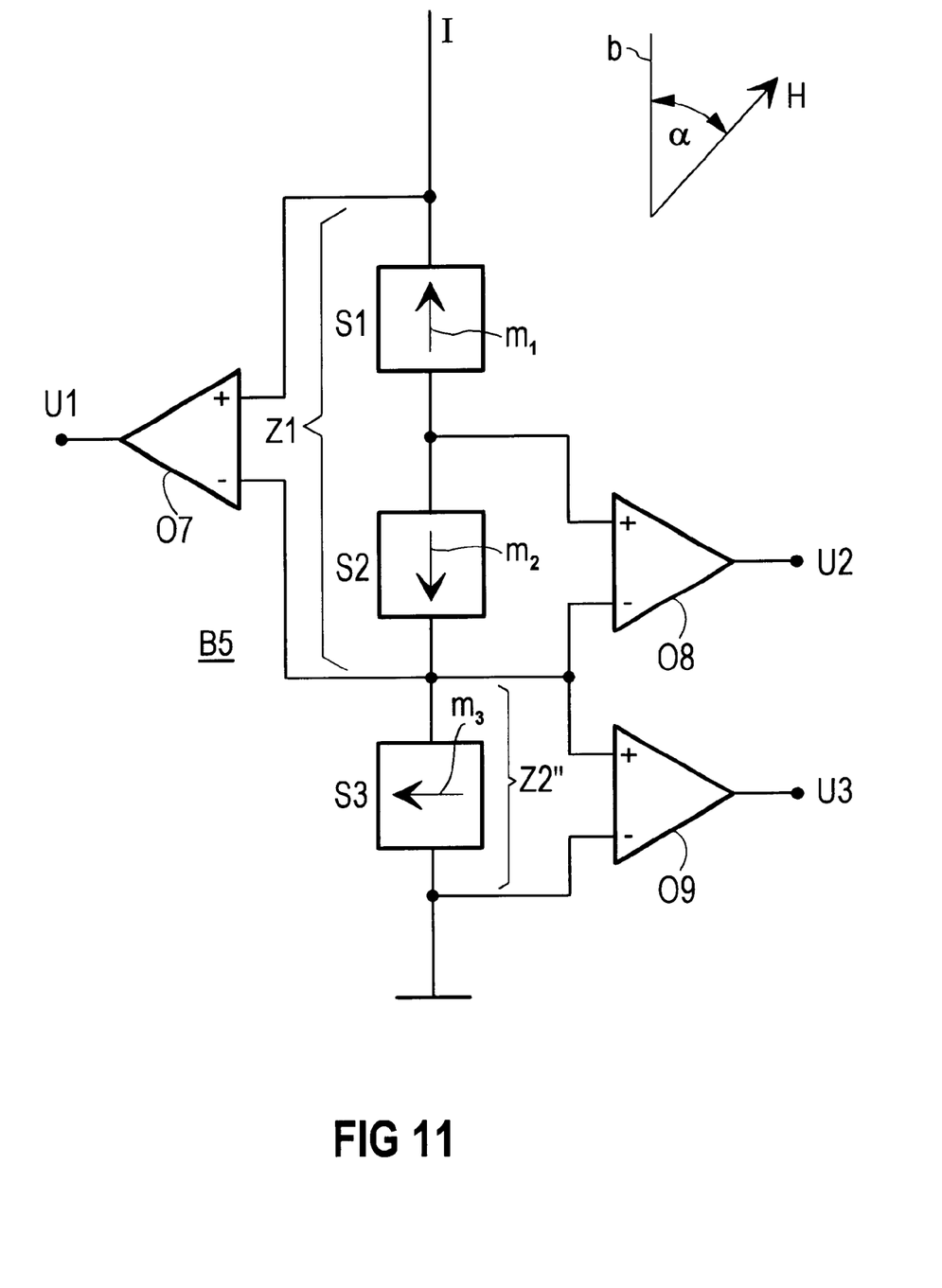
FIG. 11 is a schematic of a sensor device with three sensor elements in two branch circuits.

As FIG. 11 illustrates, to design a sensor device with 360° detection according to the present invention, the two branch circuits Z1 and Z2" of pseudo-bridge circuit B5 need not necessarily be wired in quasi-parallel on one side according to FIG. 9. Instead it is also possible for the three sensor elements S1, S2 and S3 to be connected electrically in series. In this case, the first branch circuit Z1 is assigned to sensor elements S1 and S2 with their opposite magnetizations $m_1$ and $m_2$ that define reference line b, and the second bridge branch Z2" is assigned to the third sensor element S3 with its magnetization $m_3$ which is perpendicular, for example, to reference line b. FIG. 11 also shows that voltages U1 to U3 are available at the outputs of three operational amplifiers O7 through O9. The two inputs of operational amplifier O7 are connected to the series connection of the two sensor elements S1 and S2, while the inputs of operational amplifiers O8 and O9 are connected across the single sensors S2 and S3, respectively.

What is claimed is:

1. A sensor device for detecting an external magnetic field, comprising:

a plurality of magneto-resistive sensor elements, each of the magneto-resistive sensor elements having a thin-film structure containing a magnetically soft measurement layer and a magnetically harder bias layer portion with a predetermined direction of magnetization such that each of the magneto-resistive sensor elements exhibits a giant magneto-resistive effect, wherein the directions of magnetization of the bias layer portions of at least one pair of the magneto-resistive sensor elements are oriented in an opposite direction to each other and define a reference line, and wherein the direction of magnetization of the bias layer portion of at least one additional sensor element of the magneto-resistive sensor elements forms a predetermined angle with the reference line, the predetermined angle being different from 0° and 180°.

2. The sensor device according to claim 1, wherein the predetermined angle between the direction of magnetization of the at least one additional sensor element and the reference line is between 10 and 170 degrees.

3. The sensor device according to claim 1, wherein the direction of magnetization of the bias layer portion of the at least one additional sensor element is at least approximately normal to the reference line.

4. The sensor device according to claim 1, wherein the angle between the direction of magnetization of the bias layer portion of the at least one additional sensor element and the reference line is at least 45°.

5. The sensor device according to claim 1, further comprising:

a first branch circuit including the at least one pair of the magneto-resistive sensor elements; and a second branch circuit including the at least one additional sensor element.

6. The sensor device according to claim 5, wherein a constant current flows through both the first branch circuit and the second branch circuit.

7. The sensor device according to claim 5, wherein the first branch circuit and the second branch circuit are coupled together on one side.

8. The sensor device according to claim 5, wherein the first branch circuit and the second branch circuit are connected in series.

9. The sensor device according to claim 5, wherein the first branch circuit and the second branch circuit are bridge branches of a bridge circuit which includes at least four sensor elements of the magneto-resistive sensor elements.

10. The sensor device according to claim 9, wherein the directions of magnetization of the at least four sensor elements have at least substantially opposite orientations in each of the first and second branch circuits.

11. The sensor device according to claim 1, wherein the magneto-resistive sensor elements include a first resistance component indicating a fundamental resistance and a second resistance component that depends on an external magnetic field.

12. The sensor device according to claim 11, wherein the magneto-resistive sensor elements have a substantially identical layered structure and geometry.

13. The sensor device according to claim 1, wherein the magneto-resistive sensor elements include at most three magneto-resistive sensor elements.

* * * * *